United States Patent
Lenk et al.

(10) Patent No.: US 8,450,927 B2
(45) Date of Patent: May 28, 2013

(54) PHOSPHOR-CONTAINING LED LIGHT BULB

(75) Inventors: Ronald J. Lenk, Woodstock, GA (US); Bruce Carsten, Corvallis, OR (US)

(73) Assignee: Switch Bulb Company, Inc., San Jose, CA (US)

( * ) Notice: Subject to any disclaimer, the term of this patent is extended or adjusted under 35 U.S.C. 154(b) by 173 days.

(21) Appl. No.: 12/678,287

(22) PCT Filed: Sep. 12, 2008

(86) PCT No.: PCT/US2008/010713
§ 371 (c)(1),
(2), (4) Date: Jun. 16, 2010

(87) PCT Pub. No.: WO2009/035693
PCT Pub. Date: Mar. 19, 2009

(65) Prior Publication Data
US 2010/0301727 A1    Dec. 2, 2010

Related U.S. Application Data

(60) Provisional application No. 60/972,382, filed on Sep. 14, 2007.

(51) Int. Cl.
*H05B 33/00* (2006.01)
*H01J 61/42* (2006.01)

(52) U.S. Cl.
USPC .............................................. 313/512; 313/46

(58) Field of Classification Search
USPC ................................................... 313/46, 512
See application file for complete search history.

(56) References Cited

U.S. PATENT DOCUMENTS

| | | | |
|---|---|---|---|
| 4,160,929 | A | 7/1979 | Thorington et al. |
| 4,289,991 | A | 9/1981 | Schreurs |
| 4,346,324 | A | 8/1982 | Yoldas |
| 4,405,744 | A | 9/1983 | Greinecker et al. |
| 4,584,428 | A | 4/1986 | Garlick |
| 5,140,220 | A | 8/1992 | Hasegawa |
| 5,433,738 | A | 7/1995 | Stinson |
| 5,905,343 | A | 5/1999 | McCamant |
| 6,504,301 | B1 | 1/2003 | Lowery |
| 6,513,955 | B1 | 2/2003 | Waltz |
| 6,612,712 | B2 | 9/2003 | Nepil |
| 6,639,360 | B2 | 10/2003 | Roberts et al. |

(Continued)

FOREIGN PATENT DOCUMENTS

| | | |
|---|---|---|
| EP | 0658933 B1 | 10/2001 |
| JP | 07-99372 A | 4/1995 |

(Continued)

OTHER PUBLICATIONS

International Preliminary Report on Patentability received for PCT Patent Application No. PCT/US2008/010713, mailed on Mar. 25, 2010, 6 pages.

(Continued)

*Primary Examiner* — Joseph L Williams
(74) *Attorney, Agent, or Firm* — Morrison & Foerster LLP

(57) ABSTRACT

An LED bulb, which includes a shell, a filler material within the shell of the bulb, at least one type of phosphor dispersed inside the filler material and at least one LED within the shell.

14 Claims, 4 Drawing Sheets

U.S. PATENT DOCUMENTS

| | | |
|---|---|---|
| 6,655,810 B2 | 12/2003 | Hayashi et al. |
| 6,685,852 B2 | 2/2004 | Setlur et al. |
| 6,791,259 B1 | 9/2004 | Stokes et al. |
| 6,963,688 B2 | 11/2005 | Nath |
| 7,022,260 B2 | 4/2006 | Morioka |
| 7,075,112 B2 | 7/2006 | Roberts et al. |
| 7,078,732 B1 | 7/2006 | Reeh et al. |
| 7,086,767 B2 | 8/2006 | Sidwell et al. |
| 7,213,934 B2 | 5/2007 | Zarian et al. |
| 7,288,798 B2 | 10/2007 | Chang et al. |
| 7,319,293 B2 | 1/2008 | Maxik |
| 7,344,279 B2 | 3/2008 | Mueller et al. |
| 7,489,031 B2 | 2/2009 | Roberts et al. |
| 2002/0149312 A1 | 10/2002 | Roberts et al. |
| 2003/0067265 A1* | 4/2003 | Srivastava et al. ............ 313/503 |
| 2004/0004435 A1 | 1/2004 | Hsu |
| 2004/0113549 A1 | 6/2004 | Roberts et al. |
| 2004/0245912 A1 | 12/2004 | Thurk et al. |
| 2004/0264192 A1 | 12/2004 | Nagata et al. |
| 2005/0031281 A1 | 2/2005 | Nath |
| 2005/0084229 A1 | 4/2005 | Babbitt et al. |
| 2005/0179379 A1 | 8/2005 | Kim |
| 2005/0224829 A1 | 10/2005 | Negley et al. |
| 2005/0243539 A1 | 11/2005 | Evans et al. |
| 2005/0243552 A1 | 11/2005 | Maxik |
| 2006/0007410 A1 | 1/2006 | Masuoka et al. |
| 2006/0145172 A1 | 7/2006 | Su et al. |
| 2006/0176699 A1 | 8/2006 | Crunk |
| 2006/0187653 A1 | 8/2006 | Olsson |
| 2006/0274524 A1 | 12/2006 | Chang et al. |
| 2007/0090391 A1 | 4/2007 | Diamantidis |
| 2007/0090737 A1 | 4/2007 | Hu et al. |
| 2007/0139949 A1 | 6/2007 | Tanda et al. |
| 2007/0291490 A1 | 12/2007 | Tajul et al. |
| 2008/0013316 A1 | 1/2008 | Chiang |
| 2008/0061687 A1 | 3/2008 | Cok et al. |
| 2009/0001372 A1 | 1/2009 | Arik et al. |

FOREIGN PATENT DOCUMENTS

| | | |
|---|---|---|
| JP | 3351103 B2 | 11/2002 |
| WO | 02/061805 A2 | 8/2002 |
| WO | 2005/060309 A2 | 6/2005 |
| WO | 2007/069119 A1 | 6/2007 |
| WO | 2007/130359 A2 | 11/2007 |
| WO | 2009/054948 A1 | 4/2009 |

OTHER PUBLICATIONS

International Search Report received for PCT Patent Application No. PCT/US2008/010713, mailed on Nov. 21, 2008, 1 page.

International Preliminary Report on Patentability received for PCT Patent Application No. PCT/US2008/011984, mailed on May 6, 2010, 5 pages.

International Search Report and Written Opinion received for PCT Patent Application No. PCT/US2008/011984, mailed on Jan. 15, 2009, 6 pages.

International Search Report received for PCT Patent Application No. PCT/US2009/004662, mailed on Oct. 5, 2009, 2 pages.

International Preliminary Report on Patentability received for PCT Patent Application No. PCT/US2009/004662, mailed on Mar. 3, 2011, 9 pages.

* cited by examiner

PHOSPHOR-CONTAINING LED LIGHT BULB

FIELD OF THE INVENTION

The present invention relates to replacement of bulbs used for lighting by light emitting diode (LED) bulbs, and more particularly, to the dispersal of the phosphor used by the LEDs into the bulb in order to permit greater amounts of phosphor to be used, to permit cooler operating temperature of the phosphor, and to permit the LEDs to be run at higher power.

BACKGROUND OF THE INVENTION

An LED consists of a semiconductor junction, which emits light due to a current flowing through the junction. A white LED is typically made by using a blue or ultraviolet LED die, and adding a plastic coat to it, the coat containing a phosphor. The phosphor is used to convert the blue or ultraviolet light emitted by the LED die to a spectrum of light that more or less closely resembles white light or blackbody radiation.

At first sight, it would seem that white LEDs should make an excellent replacement for the traditional tungsten filament incandescent bulb. At equal power, they give far more light output than do incandescent bulbs, or, what is the same thing, they use much less power for equal light; and their operational life is orders of magnitude larger, namely, 10-100 thousand hours vs. 1-2 thousand hours.

However, LEDs have a number of drawbacks that have prevented them, so far, from being widely adopted as incandescent replacements. One of these is that, although LEDs require substantially less power for a given light output than do incandescent bulbs, it still takes many watts to generate adequate light for illumination. Whereas the tungsten filament in an incandescent bulb operates at a temperature of approximately 3000K, an LED cannot be allowed to get hotter than approximately 120° C., and some are limited to even lower maximum temperatures. The LED thus has a substantial heat problem: If operated in vacuum like an incandescent, or even in air, the LED would rapidly get too hot and fail. This has limited available LED bulbs to very low power (less than approximately 3 W), producing insufficient illumination for incandescent replacements.

One of the reasons that an LED is limited to such a low maximum temperature is due to the temperature characteristics of the phosphor rather than the LED die itself. Presently known phosphors, especially those in the red, tend to degrade quite rapidly at elevated temperatures. Once degradation has occurred, the white light output of the LED is reduced, thus ending the useful life of the LED and of the LED bulb.

SUMMARY OF THE INVENTION

This invention has the object of developing a light emitting apparatus utilizing light emitting diodes (LEDs), such that the above-described primary problem is effectively solved. In accordance with one embodiment, a replacement bulb for incandescent lighting having a plurality of LEDs with a light output equal in intensity to that of an incandescent bulb, and wherein the LEDs' temperature may be permitted to rise much higher than the present state-of-the-art permits. The apparatus includes a bulb-shaped shell, preferentially formed of a plastic such as polycarbonate. The shell may be transparent, or may contain materials dispersed in it to disperse the light, making it appear not to have point sources of light.

The shell is filled with a filler material, which can be a fluid, a gel, a plastic or other material, such as water or a hydrogel, which is preferentially thermally conductive. The filler material acts as a means to transfer the heat power generated by the LEDs to the shell, where it may be removed by radiation and convection, as in a normal incandescent bulb. In accordance with a preferred embodiment, the filler material contains phosphor dispersed throughout the material, which changes the bluish color of the LED dice's light to a more yellowish color, more closely resembling the light from normal incandescent bulbs. It can be appreciated that in accordance with another embodiment, the filler material and phosphor material therein may also be used for changing the color emitted by other LED dice. In accordance with a preferred embodiment, the filler is preferentially electrically insulating.

In accordance with one embodiment, the phosphor may be uniformly distributed throughout the filler material. The phosphor density may be set to be higher or lower than that commonly used in LEDs today, a higher density producing more total conversion of the LED dice's light.

In accordance with another embodiment, the phosphor may be distributed in the filler material with an orientation preference, wherein the orientation preference can be used to generate light that is more intense in converted light in one direction than another.

In accordance with another embodiment, different phosphors may be distributed in the filler material with an orientation preference, wherein the orientation preference can be used to generate light that is different colors in one direction than another.

According to the present invention, a phosphor is distributed in a filler inside an LED light bulb for the purpose of changing the color of the light emitted by the LED into a more desirable color for emission from the bulb. Such a color-changing application is described in detail and set forth in Stokes et al., U.S. Pat. No. 6,791,259 (hereinafter "the '259"), which is incorporated herein by reference in its entirety with regard to all aspects thereof. As set forth in the '259 patent, a radiation-scattering material is located between the LEDs and the phosphor.

Such a filler is described in detail and set forth in Diamantidis, U.S. Publication No. 20070090391 (hereinafter "the '391 publication"), which is incorporated herein by reference in its entirety. As set forth in the '391 publication, a liquid fluid is in contact with the light-emitting chip crystal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
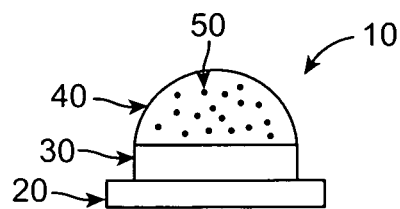
FIG. 1 is a cross-sectional view of a present state-of-the-art LED showing its construction with phosphor in its shell.

Reference will now be made in detail to the present preferred embodiments of the invention, examples of which are illustrated in the accompanying drawings. Wherever possible, the same reference numbers are used in the drawings and the description to refer to the same or like parts.

According to the design characteristics, a detailed description of the current practice and preferred embodiments is given below.

FIG. 1 is a cross-sectional view of a present state-of-the-art LED 10 showing its construction with phosphor in its shell. As shown in FIG. 1, the LED includes an LED die 30, a base 20 to which the LED die 30 is mounted for electrical and thermal connection, and a shell 40. The shell 40 is used to protect the LED die 30 from the air, forms optics for the LED die 30, and contains phosphor 50 to convert the light spectrum emitted by the LED die 30 to a more desirable spectrum.

Figure 2:
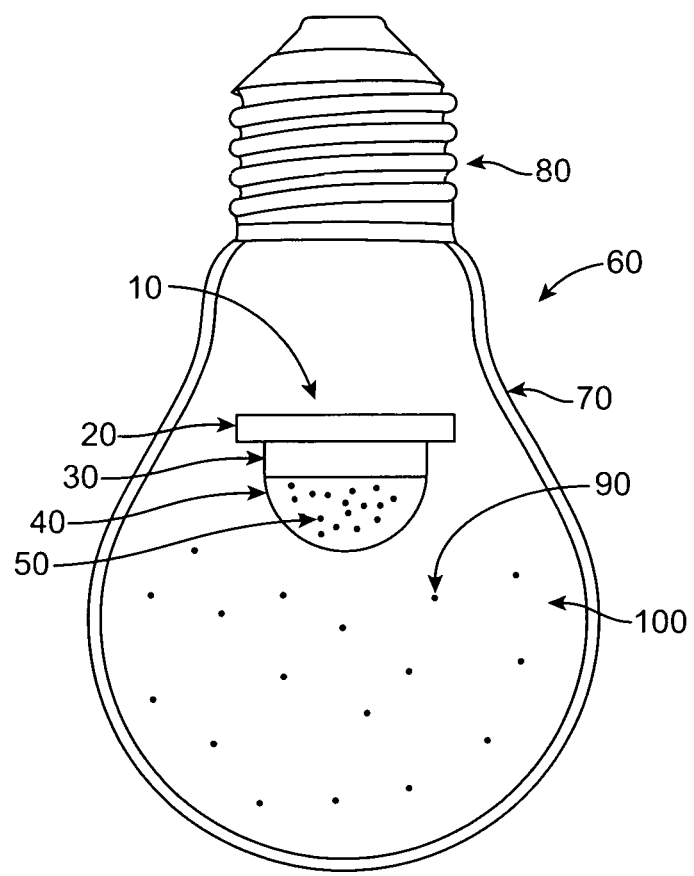
FIG. 2 is a cross-sectional view of an LED bulb showing the LED mounted in a filler material containing phosphor.

FIG. 2 is a cross-sectional view of an LED bulb 60 showing the LED 10 mounted in a filler material containing phosphor. As shown in FIG. 2, the LED includes an LED die 30, a base 20 to which the LED die 30 is mounted, and a shell 40. The shell 40 is used to protect the LED die 30 from the filler material, provides optics for the LED die 30, and contains one or more phosphors 50. The shell 70 of the LED bulb 60 contains both the LED 10 and a filler material 100. The filler material contains dispersed in it phosphor 90, to convert the light spectrum emitted by the LED 10 to a more desirable spectrum. Also shown is a screw base 80, which makes contact with an electrical socket, and converts power from the electrical socket to power suitable for powering the LED.

Figure 3:
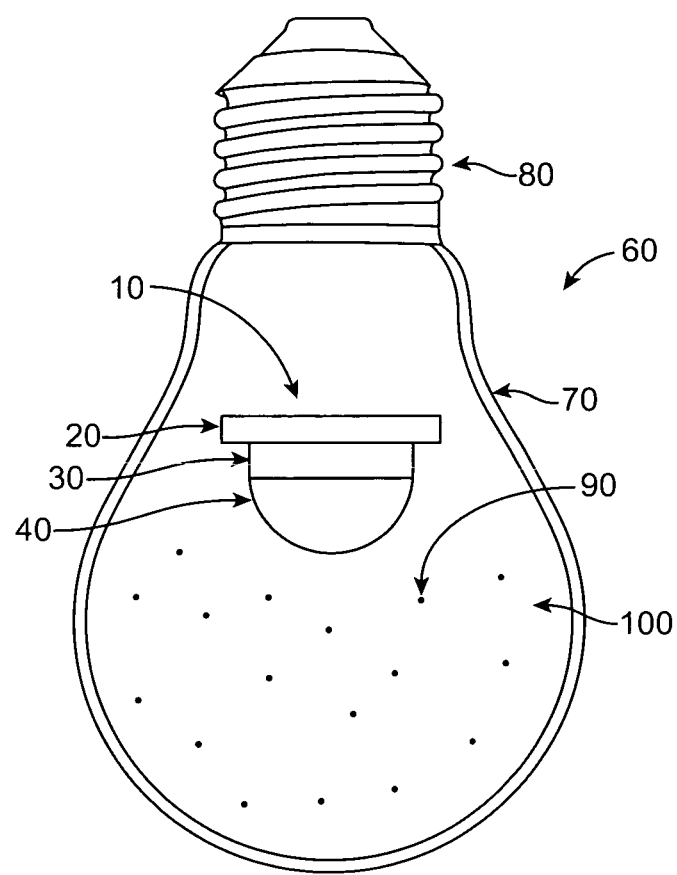
FIG. 3 is a cross-sectional view of an LED bulb showing an LED without phosphor mounted in a filler material containing phosphor.

FIG. 3 is a cross-sectional view of an LED bulb 60 showing an LED 10 mounted in a filler material containing phosphor. As shown in FIG. 3, the LED includes an LED die 30, a base 20, and a shell 40. The shell 40 is used to protect the LED die 30 from the filler material, and may form optics, but contains no phosphor. The shell 70 of the LED bulb 60 contains both the LED 10 and a filler material 100. Said filler material contains dispersed in it one or more phosphors 90, to convert the light spectrum emitted by the LED 10 to a more desirable spectrum. Also shown is a screw base 80, which makes contact with an electrical socket, and converts power from the electrical socket to power suitable for powering the LED.

Figure 4:
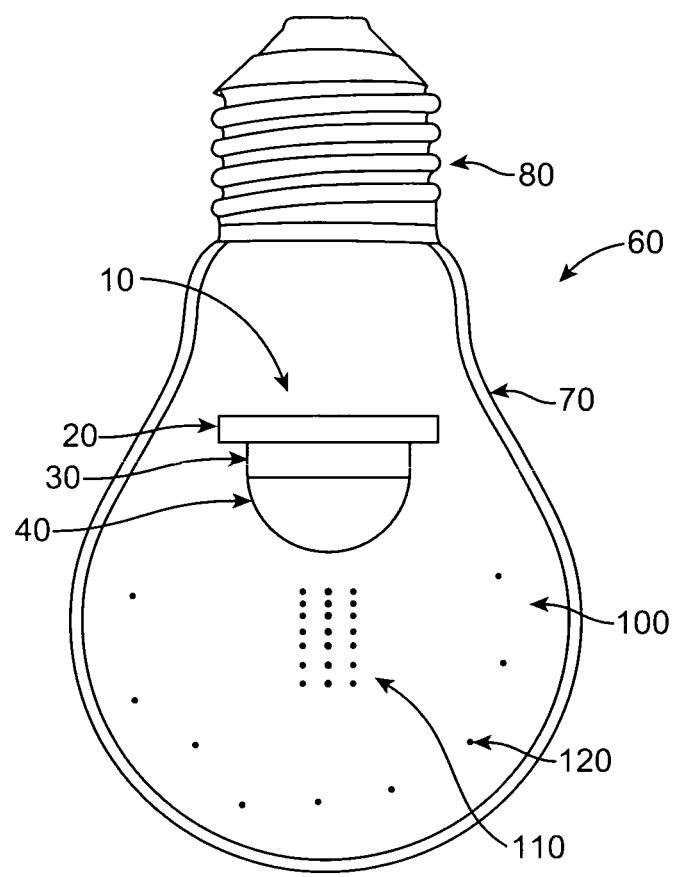
FIG. 4 is a cross-sectional view of an LED bulb showing the LED mounted in a filler material containing phosphor with an orientation preference.

FIG. 4 is a cross-sectional view of an LED bulb 60 showing the LED 10 mounted in a filler material containing phosphor with an orientation preference. As shown in FIG. 4, the LED includes an LED die 30, a base 20, and a shell 40. The shell 40 is used to protect the LED die 30 from the filler material, but contains no phosphor. The shell 70 of the LED bulb 60 contains both the LED 10 and a filler material 100. Said filler material contains dispersed in it a single phosphor 110 and 120, to convert the light spectrum emitted by the LED 10 to a more desirable spectrum. Said phosphor is not uniformly distributed in the filler material 100, but rather has a preferred orientation. Shown as an example, a portion of the phosphor 110 is concentrated towards the middle of the bulb 60, whereas another portion of the phosphor 120 is distributed throughout the rest of said bulb. Also shown is a screw base 80, which makes contact with an electrical socket, and converts power from the electrical socket to power suitable for powering the LED.

Figure 5:
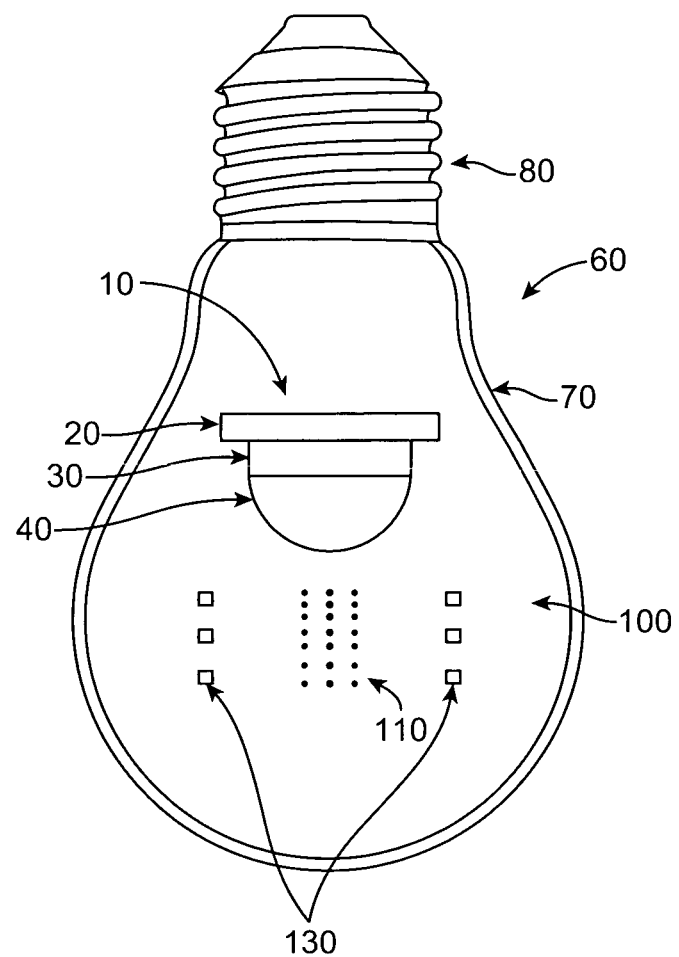
FIG. 5 is a cross-sectional view of an LED bulb showing the LED mounted in a filler material containing multiple phosphors with an orientation and location preference.

FIG. 5 is a cross-sectional view of an LED bulb 60 showing the LED 10 mounted in a filler material containing multiple phosphors with an orientation and location preference. As shown in FIG. 5, the LED includes an LED die 30, a base 20, and a shell 40. The shell 40 is used to protect the LED die 30 from the filler material, but contains no phosphor. The shell 70 of the LED bulb 60 contains both the LED 10 and a filler material 100. The filler material contains in this example dispersed in it two different phosphors 110, 130 (i.e., a first and a second phosphor 111, 130), to convert the light spectrum emitted by the LED 10 to more desirable spectra. In accordance with one embodiment, the phosphors 110, 130 are not uniformly distributed in the filler material 100, but rather have a preferred orientation and location. As shown, a first phosphor 110 is preferentially distributed towards the middle of the bulb 60, whereas a second phosphor 130 is preferentially distributed towards the outside of the bulb. Also shown is a screw base 80, which makes contact with an electrical socket, and converts power from the electrical socket to power suitable for powering the LED.

It will be apparent to those skilled in the art that various modifications and variation can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) bulb comprising:
   a shell having a volume defined within the shell;
   a fluid that fills the volume defined within the shell of the bulb;
   at least one type of phosphor distributed throughout the fluid; and
   at least one LED disposed within the volume defined within the shell.

2. An LED bulb as set forth in claim 1, wherein the fluid is thermally conductive.

3. An LED bulb as set forth in claim 1, wherein the at least one phosphor is uniformly distributed throughout the fluid.

4. An LED bulb as set forth in claim 1, wherein the at least one phosphor has a non-uniform distribution throughout the fluid.

5. An LED bulb as set forth in claim 1, wherein the at least one phosphor is comprised of at least two phosphors, and wherein the at least two phosphors comprises at least one phosphor having a different distribution from the others throughout the fluid.

6. An LED bulb as set forth in claim 1, wherein the at least one LED is a blue or ultraviolet LED without a phosphor.

7. An LED bulb as set forth in claim 1, wherein the at least one LED is a blue or ultraviolet LED die.

8. A light-emitting diode (LED) incandescent bulb replacement comprising:
   an incandescent bulb-shaped shell having a volume defined within the shell;
   a fluid that fills the volume defined within the shell of the bulb;
   at least one type of phosphor distributed throughout the fluid; and
   at least one LED disposed within the volume defined within the shell.

9. An LED bulb as set forth in claim 8, wherein the fluid is thermally conductive.

10. An LED bulb as set forth in claim 8, wherein the at least one phosphor is uniformly distributed throughout the fluid.

11. An LED bulb as set forth in claim 8, wherein the at least one phosphor has a non-uniform distribution throughout the fluid.

12. An LED bulb as set forth in claim 8, wherein the at least one phosphor is comprised of at least two phosphors, with at least one phosphor having a different distribution from the other phosphors throughout the fluid.

13. An LED bulb as set forth in claim 8, wherein the at least one LED is a blue or ultraviolet LED without a phosphor.

14. An LED bulb as set forth in claim 8, wherein the at least one LED is a blue or ultraviolet LED die.

* * * * *